(12) United States Patent
Yamamoto

(10) Patent No.: US 8,043,728 B2
(45) Date of Patent: Oct. 25, 2011

(54) HARD COATING FILM FOR FORMING TOOL AND FORMING TOOL

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 147 days.

(21) Appl. No.: 11/968,453

(22) Filed: Jan. 2, 2008

(65) Prior Publication Data

US 2008/0171183 A1 Jul. 17, 2008

(30) Foreign Application Priority Data

Jan. 17, 2007 (JP) .................... 2007-008323

(51) Int. Cl.
  *B32B 9/00* (2006.01)
(52) U.S. Cl. ........ 428/697; 428/216; 428/336; 428/698; 428/699; 428/704
(58) Field of Classification Search .......... 428/697, 428/698, 699, 704, 216, 336
See application file for complete search history.

(56) References Cited

U.S. PATENT DOCUMENTS

| | | | |
|---|---|---|---|
| 5,810,947 A | 9/1998 | Wu et al. | |
| 6,811,899 B2 | 11/2004 | Inoue | |
| 6,824,601 B2 * | 11/2004 | Yamamoto et al. | 428/698 |
| 7,096,921 B2 | 8/2006 | Moore et al. | |
| 7,348,074 B2 * | 3/2008 | Derflinger | 428/699 |
| 7,537,822 B2 * | 5/2009 | Ishikawa | 428/699 |
| 2004/0237840 A1 | 12/2004 | Yamamoto et al. | |
| 2006/0222893 A1 | 10/2006 | Derflinger | |

FOREIGN PATENT DOCUMENTS

| | | |
|---|---|---|
| EP | 1 219 723 A2 | 7/2002 |
| EP | 1 726 686 A1 | 11/2006 |
| JP | 11-505573 | 5/1999 |

(Continued)

OTHER PUBLICATIONS

U.S. Appl. No. 12/392,655, filed Feb. 25, 2009, Yamamoto, et al.

(Continued)

*Primary Examiner* — A. A. Turner
(74) *Attorney, Agent, or Firm* — Oblon, Spivak, McClelland, Maier & Neustadt, L.L.P.

(57) ABSTRACT

A hard coating film excellent in wear resistance and seizure resistance for coating a forming tool of a Cr-containing iron-base alloy includes a first coating layer A of a thickness between 1 and 10 μm formed on the forming tool and a second coating layer B of a thickness between 2 and 10 μm overlying the coating layer A. The first coating layer A is a film of $Cr_{1-x}M_x(B_aC_bN_{1-a-b})$ meeting conditions expressed by expressions: $0 \leq x \leq 0.7$, $0 \leq a \leq 0.2$ and $0 \leq B \leq 0.5$, where M is at least one element among W, V, Mo, Nb, Ti and Al, x is atomic ratio of M, a is atomic ratio of B and b is atomic ratio of C, and the second coating layer B is a film of $Ti_{1-X-Y-Z}Cr_XAl_YL_Z(B_BC_AN_{1-A-B})$ meeting conditions expressed by expressions: $0 \leq 1-X-Y-Z \leq 0.5$, $0<X \leq 0.5$, $0.4 \leq Y \leq 0.7$, $0 \leq Z \leq 0.15$, $0 \leq A \leq 0.5$, and $0 \leq B \leq 0.2$, where L is at least either of Si and Y, X is atomic ratio of Cr, Y is atomic ratio of Al, Z is atomic ratio of L, A is atomic ratio of C and B is atomic ratio of B.

8 Claims, 1 Drawing Sheet

FOREIGN PATENT DOCUMENTS

| | | |
|---|---|---|
| JP | 2000-1768 | 1/2000 |
| JP | 2000-38653 | 2/2000 |
| JP | 2000-144376 | 5/2000 |
| JP | 2002-307128 | 10/2002 |
| JP | 2002-307129 | 10/2002 |
| JP | 2003-71610 | 3/2003 |
| JP | 2004-74361 | 3/2004 |
| JP | 2004-74361 A | 3/2004 |
| JP | 2005-42146 | 2/2005 |
| JP | 2005-139515 | 6/2005 |
| JP | 2006-137982 A | 6/2006 |
| JP | 2006-518632 | 8/2006 |
| KR | 2002-0055444 | 7/2002 |
| KR | 10-2006-0034418 | 4/2006 |
| WO | 2005/040448 * | 5/2005 |

OTHER PUBLICATIONS

U.S. Appl. No. 12/426,409, filed Apr. 20, 2009, Yamamoto.

K. Ichijo, et al., "Microstructures of (Ti,Cr,Al,Si)N Films Synthesized by Cathodic Arc Method", Surface & Coatings Technology 201 (2007) pp. 5477-5480.

Kenji Yamamoto, et al., "Structural and mechanical property of Si incorporated (Ti, Cr, Al)N coatings deposited by arc ion plating process", Surface & Coating Technology, Elsevier, Surface & Coating Technology 200 (2005), pp. 1383-1390.

Office Action issued Nov. 2. 2010, in Japan Patent Application No. 2007-008323 (with English-language Translation).

* cited by examiner

HARD COATING FILM FOR FORMING TOOL AND FORMING TOOL

BACKGROUND OF THE INVENTION

1. Field of the Invention

The present invention relates to a hard coating film for a forming tool and a forming tool coated with the same. More particularly, the present invention relates to a hard coating film, for a forming tool, excellent in wear resistance and a forming tool coated with the same.

2. Description of the Related Art

It has been usual to improve the wear resistance and the seizure resistance of a forming tool, such as a forming die, by a nitriding process. Recently, studies have been made to improve the wear resistance and the seizure resistance of a forming tool by a vapor-phase coating method, such as a PVD process. A tool disclosed in, for example, JP-A 2000-144376 (Cited reference 1) is coated with a composite nitride containing at least two elements among Cr, Al, Ti and V to improve sliding performance. Surface-coated forming dies excellent in wear resistance and seizure resistance disclosed in JP-A 2002-307128 (Cited reference 2) and JP-A 2002-307129 (Cited reference 3) are coated with a nitride, a carbide and a carbonitride of at least one element among Ti, V, Al, Cr and Si, and, in some cases, coated with a film of a sulfide layer containing Ti, Cr and Mo as the rest in addition to the former film. A surface-coating material excellent in wear resistance and seizure resistance disclosed in JP-A 2000-1768 (Cited reference 4) is obtained by coating a hard nitride layer with a $MoS_2$ layer.

Although the composite nitride containing at least two elements among Cr, Al, Ti and V disclosed in Cited reference 1 has a high hardness and is excellent in wear resistance, the composite nitride is unsatisfactory in seizure resistance. A tool coated with a film of this composite nitride cannot withstand a severe working process, such as a metal forming process that exerts high pressure on the surface of the tool. Although a nitride, a carbide and a carbonitride of at least one element among Ti, V, Al, Cr and Si disclosed in Cited reference 2 have high hardness, the same are unsatisfactory in seizure resistance. When a sulfide film is used to improve seizure resistance as mentioned in Cited references 3 and 4, the sulfide film is effective in improving sliding performance at an early stage of use. However, since the sulfide is soft, the sulfide coating wears with time of use is unsatisfactory in durability. A film excellent in sliding performance is proposed in JP-A 2006-124818. This previously proposed film contains $X_CM_{1-C}(B_aC_bN_{1-a-b})$ [X: at least one element among 4a, 5a, 6a, Al, Si, Fe, Co and Ni, M: at least one element among V, Mo and W]. Although this film, similarly to the sulfide film, is effective in improving sliding performance at an early stage of use, this film is unsatisfactory in durability. When a ferrous base having a low hardness is coated with a film of one of a nitride, a carbide and a carbonitride of at least one element among Ti, V, Al, Cr and Si, the film tends to come off the ferrous base due to the difference in plastic deformation between the ferrous base and the film.

SUMMARY OF THE INVENTION

The present invention has been made under such circumstances and it is therefore an object of the present invention to provide a hard coating film excellent in wear resistance and seizure resistance for coating a forming tool, and a forming tool excellent in wear resistance and seizure resistance. The inventors of the present invention made earnest studies and made the present invention.

A hard coating film in a first aspect of the present invention for coating a forming tool of a Cr-containing iron-base alloy includes: a first coating layer A of a thickness between 1 and 10 μm formed on the forming tool of a Cr-containing iron-base alloy; and a second coating layer B of a thickness between 2 and 10 μm overlying the coating layer A; wherein the first coating layer A is a film of $Cr_{1-x}M_x(B_aC_bN_{1-a-b})$ meeting conditions expressed by expressions:

$$0 \leq x \leq 0.7 \tag{1A}$$

$$0 \leq a \leq 0.2 \tag{2A}$$

$$0 \leq b \leq 0.5 \tag{3A}$$

where M is at least one element among W, V, Mo, Nb, Ti and Al, x is the atomic ratio of M, a is the atomic ratio of B and b is the atomic ratio of C, and the second coating layer B is a film of $Ti_{1-X-Y-Z}Cr_XAl_YL_Z(B_BC_AN_{1-A-B})$ meeting conditions expressed by expressions:

$$0 \leq 1-X-Y-Z \leq 0.5 \tag{1B}$$

$$0X \leq 0.5 \tag{2B}$$

$$0.4 \leq Y \leq 0.7 \tag{3B}$$

$$0 \leq Z \leq 0.15 \tag{4B}$$

$$0 \leq A \leq 0.5 \tag{5B}$$

$$0 \leq B \leq 0.2 \tag{6B}$$

where L is at least either of Si and Y, X is the atomic ratio of Cr, Y is the atomic ratio of Al, Z is the atomic ratio of L, A is the atomic ratio of C, and B is the atomic ratio of B.

In the hard coating film in the first aspect of the present invention, the first coating layer A may be a film of CrN, and the second coating layer B may be a film of $Ti_{1-X-Y-Z}Cr_XAl_YL_ZN$ meeting conditions expressed by expressions:

$$0 \leq 1-X-Y-Z \leq 0.5 \tag{1C}$$

$$0 < X \leq 0.5 \tag{2C}$$

$$0.5 \leq Y \leq 0.6 \tag{3C}$$

$$0.01 \leq Z \leq 0.05 \tag{4C}$$

In this hard coating film, the first coating layer A may be a film of CrN, and the second coating layer B may be a film of $Ti_{1-X-Y-Z}Cr_XAl_YSi_ZN$ meeting conditions expressed by expressions:

$$0 \leq 1-X-Y-Z \leq 0.5 \tag{1C}$$

$$0 < X \leq 0.5 \tag{2C}$$

$$0.5 \leq Y \leq 0.6 \tag{3C}$$

$$0.01 \leq Z \leq 0.05 \tag{4C}$$

In any one of the foregoing hard coating films, a laminated film formed by laminating films each including a coating layer C meeting conditions identical with or different from those for the first coating layer A and a coating layer D meeting conditions identical with or different from the conditions for the second coating layer B, the films of the laminated film are laminated at a lamination period of 300 nm or below and having a thickness of 300 nm or below may be formed in a total thickness of 0.1 μm or greater between the first coating layer A and the second coating layer B.

In this hard coating film, the forming tool of the Cr-containing iron-base alloy may contain a Cr-containing carbide precipitated and may have a Rockwell hardness of HRC 50 or above.

In this hard coating film, the forming tool of a Cr-containing iron-base alloy may have a surface diffusion layer formed by subjecting the surface thereof to nitriding, carburizing or carbonitriding.

A forming tool in a second aspect of the present invention may have a surface coated with any one of the foregoing hard coating films.

The hard coating film of the present invention for the forming tool is superior to the conventional surface coating layer in wear resistance and seizure resistance and is suitable for coating a forming tool, such as a forming die, to improve the durability of the forming tool. The forming tool of the present invention excellent in wear resistance and seizure resistance is suitable for use as a forming die or the like.

DESCRIPTION OF THE PREFERRED EMBODIMENTS

Figure 1:
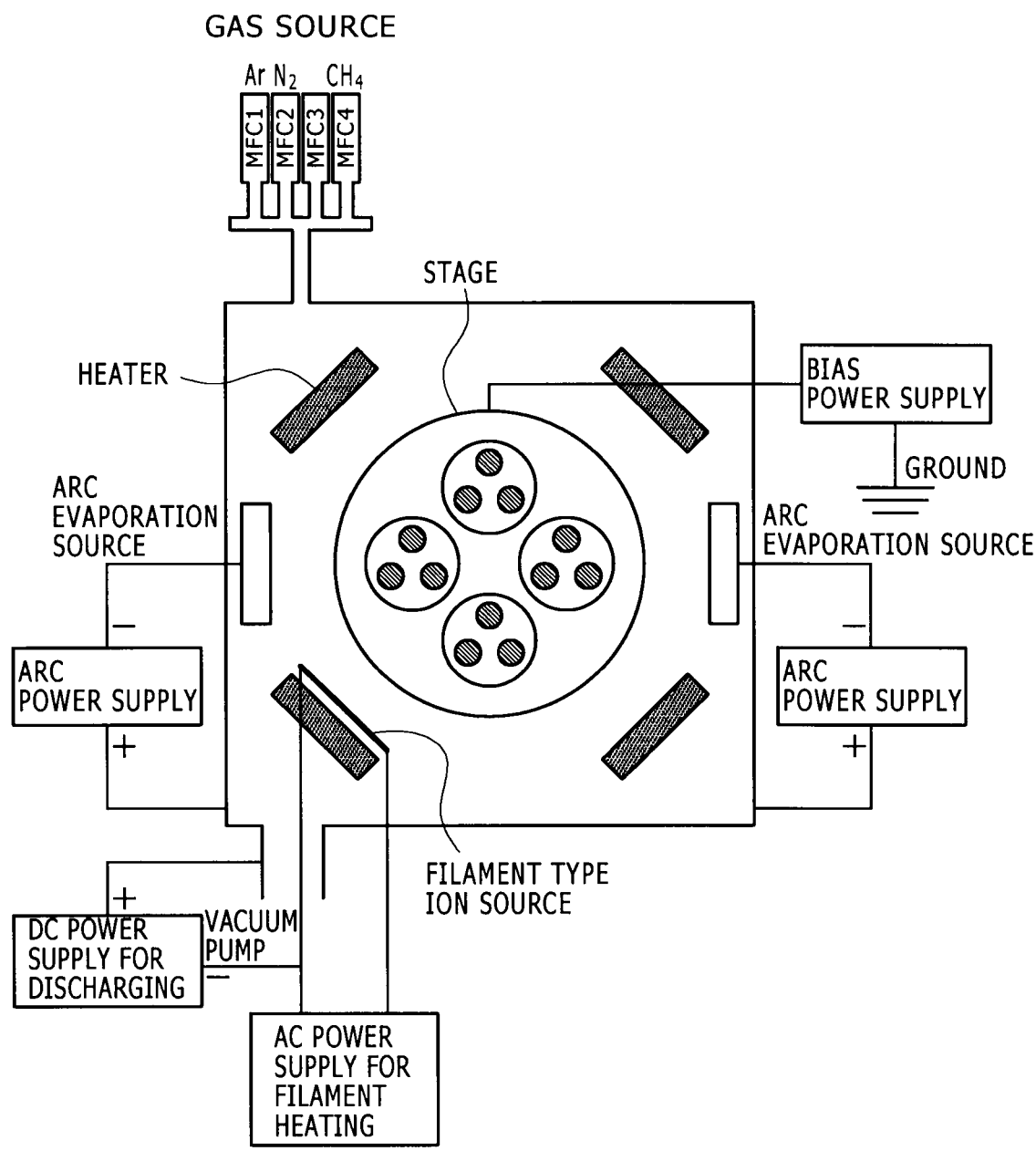
FIG. 1 is a typical view of a film forming system for forming a film embodying the present invention.

A hard coating film in a first embodiment according to the present invention for coating a forming tool includes a first coating layer A of a thickness between 1 and 10 μm formed on a base of an iron-base alloy containing Cr, and a second coating layer B of a thickness between 2 and 10 μm overlying the coating layer A. The first coating layer A is a film of $Cr_{1-x}M_x(B_aC_bN_{1-a-b})$ meeting conditions expressed by expressions:

$$0 \leq x \leq 0.7 \quad (1A)$$

$$0 \leq a \leq 0.2 \quad (2A)$$

$$0 \leq b \leq 0.5 \quad (3A)$$

where M is at least one element among W, V, Mo, Nb, Ti and Al, x is the atomic ratio of M, a is the atomic ratio of B and b is the atomic ratio of C.

The second coating layer B is a film of $Ti_{1-X-Y-Z}Cr_XAl_YL_Z(B_BC_AN_{1-A-B})$ meeting conditions expressed by expressions:

$$0 \leq 1-X-Y-Z \leq 0.5 \quad (1B)$$

$$0X \leq 0.5 \quad (2B)$$

$$0.4 \leq Y \leq 0.7 \quad (3B)$$

$$0 \leq Z \leq 0.15 \quad (4B)$$

$$0 \leq A \leq 0.5 \quad (5B)$$

$$0 \leq B \leq 0.2 \quad (6B)$$

where L is at least either of Si and Y, X is the atomic ratio of Cr, Y is the atomic ratio of Al, Z is the atomic ratio of L, A is the atomic ratio of C, and B is the atomic ratio of B.

The first coating layer A is a lower layer. In the chemical formula of the first coating layer A, 1−x is the atomic ratio of Cr of 0.3 or above. The base of the iron-base alloy containing Cr (hereinafter, referred to as "Cr-containing iron-base alloy base"). The first coating layer A contains Cr to enhance the adhesion between the first coating layer A and the Cr-containing iron-base alloy base. The adhesion between the Cr-containing iron-base alloy base and the first coating layer A is insufficient if the atomic content (1−x) of Cr is below 0.3. Preferably, the atomic content (1−x) of Cr is 0.4 or above. The hardness of the first coating layer A can be improved by adding M, namely, at least one element among W, V, Mo, Nb, Ti and Al, to the material forming the first coating layer A. The atomic ratio (1−x) of Cr is low and cannot be 0.3 or above if the atomic ratio x of M is excessively high. When M represents to or more elements, the atomic ratio x is the sum of the respective atomic ratios of those elements. Therefore, the atomic ratio x of M is 0.7 or below.

Nitrogen (N) is essential to forming a film having a high hardness. The atomic ratio of N is $(1-a-b) \leq 1$. Addition of B and C increases the hardness of the film. The atomic ratios of B and C may be 0.2 or below and 0.5 or below, respectively. The atomic ratio a of B is 0.2 or below and the atomic ratio b of C is 0.5 or below.

The first coating layer A is low in hardness and acid resistance. The first coating layer A generates heat and is oxidized and abraded when rubbed. Therefore, the first coating layer A is coated with the second coating layer B, namely, a wear-resistant layer. The material forming the second coating layer B contains Al in an Al atomic ratio Y of 0.4 or above to improve the oxidation resistance of the second coating layer B. An excessively high Al content softens the film. Therefore, the Al atomic ratio Y of the second coating layer B is 0.7 or below; that is, the Al atomic ratio Y is between 0.4 and 0.7, preferably, between 0.5 and 0.6. An Al film is a soft film of a hexagonal crystal system. Therefore, the second layer B needs to contain Cr. The Al content decreases and the oxidation resistance of the film decreases as the Cr content increases. The upper limit of the Cr atomic ratio X is 0.5. Therefore, it is preferable that the Cr atomic ratio X is between 0.1 and 0.3.

Desirably, the second coating layer B contains Ti in addition to Cr. The addition of Cr and Ti to the second coating layer B improves both the hardness and the oxidation resistance of the second coating layer B. The Al content decreases and the oxidation resistance decreases as the Ti content increases. Therefore, the Ti atomic ratio (1−X−Y−Z) is 0.5 or below. When the second coating layer B contains both Cr and Ti, it is desirable from the viewpoint of improving hardness and oxidation resistance that the Cr atomic ratio X is 0.05 or above and the Ti atomic ratio (1−X−Y−Z) is 0.05 or above. It is still more desirable that that the Cr atomic ratio X is 0.1 or above and the Ti atomic ratio (1−X−Y−Z) is 0.15 or above.

For the further improvement of oxidation resistance, L (at least either of Si and Y) may be added. Either Si or Y or both Si and Y may be added. Since hardness decreases if an excessively large amount of L is added, the upper limit of the atomic ratio Z of L (the sum of the Si and the Y atomic ratio when both Si and Y are added) is 0.15. Preferably, the atomic ratio Z of L is 0.1 or below, more desirably, 0.05 or below.

Nitrogen (N) is essential to forming a film having high hardness. The atomic ratio (1−A−B) of N of the second coating layer B is 1 or below. The second coating layer B may contain B and C in atomic ratios of 0.2 or below and 0.5 or below, respectively, to increase the hardness of the second coating layer B. Preferably, the atomic ratio B of B is 0.2 or below and the atomic ratio A of C is 0.5 or below.

The first coating layer A can adhere firmly to the Cr-containing iron-base alloy base, has mechanical properties, such as hardness and Young's modulus, which are between those of the second coating layer B and those of the Cr-containing iron-base alloy base, and is capable of moderating the adverse effect of the difference in the mode of deformation under external force between the second coating layer B, namely, the wear-resistant layer, and those of the Cr-containing iron-base alloy base. Therefore, the thickness of the first coating layer A needs to be 1 μm or above. Preferably, the thickness of the first coating layer A is 3 μm or above. The second coating layer B needs to have a thickness of 2 μm or above to exercise wear resistance satisfactory. Preferably, the thickness of the second coating layer B is 3 μm or above. The effect of the first coating layer A on moderating the adverse effect of the difference in the mode of deformation between the second coating layer B and the Cr-containing iron-base alloy base saturates when the thickness of the first coating layer A increases beyond 10 μm. Therefore it is preferable that the thickness of the first coating layer a is 10 μm or below. When the second coating layer B has a thickness above 10 μm, an excessively high stress is induced in the second coating layer B and the second coating layer B is liable to come off the first coating layer A. Therefore, the thickness of the second coating layer B needs to be 10 μm or below.

The hard coating film for a forming tool of the present invention includes the first coating layer A having the foregoing thickness and the foregoing composition and formed on the Cr-containing iron-base alloy base, and the second coating layer B having the foregoing thickness and the foregoing composition formed on the first coating layer A. The coating film of the present invention is more excellent than the conventional coating film having the surface coating layer in wear resistance and seizure resistance. The coating film is suitable for coating a forming tool, such as a forming die and improving the durability of the forming tool.

A hard coating film in a second embodiment according to the present invention includes a first coating layer A and a second coating layer B represented by chemical formulas similar to those representing the first coating layer A and the second coating layer B of the hard coating film in the first embodiment. In the chemical formula representing the first coating layer of the hard coating film in the first embodiment, the atomic ratio a of B is 0, the atomic ratio b of C is 0, the atomic ratio x of M is 0 and the atomic ratio (1−a−b) of N is 1 for the first coating layer A of the hard coating film in the second embodiment. In the chemical formula representing the second coating layer B of the hard coating film in the first embodiment, the atomic ratio Y of Al is between 0.5 and 0.6, the atomic ratio Z of L (at least either of Si and Y) is between 0.01 and 0.05 for the second layer B of the hard coating film in the second embodiment. Whereas the composition of the first coating layer A in the first embodiment is represented by $Cr_{1-x}M_x(B_aC_bn_{1-a-b})$ the composition of the first coating layer A in the second embodiment is represented by CrN. The respective ranges of the atomic ratio Y of B and the atomic ratio Z of L of the second coating layer are narrower than those of the second coating layer B in the first embodiment. The range of the atomic ratio Y of Al is narrowed to maintain the oxidation resistance at a high level and to suppress the softening of the film effectively. The range of the atomic ratio Z of L is narrowed to maintain the oxidation resistance at a high level and to suppress the reduction of the hardness effectively.

A hard coating film in a third embodiment according to the present invention includes a first coating layer A, and a second coating layer B similar to that of the second embodiment. The second coating layer B of the third embodiment contains only Si as L instead of at least either of Si and Y.

A hard coating film in a fourth embodiment according to the present invention includes, in addition to the first coating layer A and the second coating layer B of any one of the hard coating films in the first to the third aspect of the present invention, a laminated film formed by laminating films each including a coating layer C meeting the same conditions as the conditions for the first coating layer A or meeting conditions expressed by other expressions and a coating layer D meeting the same conditions as the conditions for the second coating layer B or meeting conditions expressed by other expressions and having a thickness of 300 nm or below, and formed in a total thickness of 0.1 μm or greater between the first coating layer A and the second coating layer B. The laminated films can increase the adhesion between the first coating layer A and the second coating layer B and can prevent the separation of the first coating layer A and the second coating layer B from each other when an external force is exerted on the hard coating film. When the thickness of each of the films of the laminated film is above 300 nm, the laminated film is ineffective in improving the adhesion. Preferably, the thickness of each of the films of the laminated film is 100 nm or below. When the total thickness of the films forming the laminated film is below 0.1 μm, the laminated film is ineffective in suppressing the separation of the first coating layer A and the second coating layer B from each other. Preferably, the total thickness of the films of the laminate film is 0.5 μm or above. The adhesion improving effect of the laminated film having a total thickness above 5 μm is not different from that of the laminated film having a total thickness of 5 μm or below. Therefore, a recommended total thickness of the films of the laminated film is 5 μm or below. When the respective compositions of the coating layers C and D of each of the films of the laminated film are similar to the composition of the first coating layer A and/or the composition of the second coating layer B, the adhesion between the laminated film and the first coating layer A and/or between the laminated film and the second coating layer B is high, and hence the adhesion between the first coating layer A and the second coating layer B is high.

The hard coating film in the fourth embodiment is particularly effective when the iron-base alloy base contain a precipitated carbide containing Cr (hereinafter, referred to as "Cr-containing carbide precipitate"). The Cr-containing carbide precipitate is a precipitated, such as $M_7C_3$, where M is Fe or Cr, containing chromium carbide. The Cr-containing iron-base alloy containing the Cr-containing carbide precipitate is one of those designated by SKD11, SKD61 and SKH51 specified in JIS. Although there is no limit to the Cr content of the Cr-containing iron-base alloy, a standard Cr content of the Cr-containing iron-base alloy is 5% by weight or above. The Cr-containing carbide precipitate and the matrix of the Cr-containing iron-base alloy base containing the Cr-containing carbide precipitate differ from each other in mechanical properties, such as hardness, Young's modulus and such. Therefore the respective modes of elastic-plastic deformation under external force of the matrix and the Cr-containing carbide precipitate of the Cr-containing iron-base alloy base differ from each other. When the Cr-containing iron-base alloy base is coated with a hard coating film, cracks develop in the interface between the carbide precipitate and the matrix and, consequently, the coating film coating the Cr-containing iron-base alloy base is liable to come off. The hard coating film in the fourth embodiment for a forming tool can limit the influence of an external force on the Cr-containing iron-base alloy base at a minimum. Therefore, even if the Cr-containing iron-base alloy base contains a Cr-containing carbide precipitate, damage to the hard coating film due to the difference in the respective modes of elastic-plastic deformation of the matrix and the Cr-containing carbide precipitate of the Cr-containing iron-base alloy base can be suppressed. However, the Cr-containing iron-base alloy base is susceptible to the influence of an external force if the Cr-containing iron-base alloy base is soft. Therefore it is desirable that the Cr-containing iron-base alloy base has a hardness of HRC 50 or above, preferably, HRC 55 or above.

Hardening the matrix of the Cr-containing iron-base alloy base by nitriding, carburizing or carbonitriding is effective in increasing the hardness of the surface of the Cr-containing iron-base alloy base to reduce differences in mechanical properties between the carbide precipitate and the matrix to a minimum. That is, it is effective to form a diffusion layer in the surface of the Cr-containing iron-base alloy base by nitriding, carburizing or carbonitriding in reducing differences in mechanical properties between the carbide precipitate and the matrix to a minimum. Although the desirable thickness of the diffusion layer is 10 μm or above, it is preferable to form the diffusion layer in a thickness of 100 μm or above when the Cr-containing iron-base alloy base is used for forming apart which is expected to be heavily loaded because the influence of an external force reaches the depth of the part of the Cr-containing iron-base alloy base.

A forming tool, such as a forming die, coated with any one of the hard coating films in the foregoing embodiments is excellent in wear resistance and seizure resistance and has improved durability.

Hard coating films in examples of the present invention and in comparative examples will be described.

Test 1

Hard coating films having compositions shown in Tables 1 and 2 were formed by using a film deposition system shown in FIG. 1 having plural arc evaporation sources. Hard coating films for examining composition, hardness and crystal structure were formed on mirror-finished substrates, namely, bases, of a hard metal. Hard coating films for a high-temperature slide test were formed on substrates of SKD11 having a hardness of HRC 60. The substrates were placed in a deposition chamber, the deposition chamber was evacuated to a vacuum of $1\times10^{-3}$ Pa or below, the substrates were heated at about 400° C., and the surfaces of the substrates were subjected to a sputter cleaning process using Ar ions. The arc evaporation sources were 100 mm diameter targets. An arc current of 150 A was used. Films were deposited in an atmosphere of $N_2$ or a mixed gas of $N_2$ and $CH_4$ of 4 Pa in total pressure.

First, a first coating layer A was formed on a substrate, namely, a base, by using targets having the same composition as the first coating layer A, and then a second coating layer B was formed on the first coating layer A by using targets having the same composition as the second coating layer B.

The composition, hardness and crystal structure of those hard coating films were examined. The hard coating films were subjected to a high-temperature slide test to test the hard coating films for wear resistance and to determine coefficient of friction. An EPMA was used for determining the composition of the hard coating film. A micro-Vickers hardness tester was used to measure the hardness of the hard coating film. Conditions for hardness measurement were 0.25 N in measuring load and 15 s in measuring time. Conditions for the high-temperature slide test are shown below.

An oxidation start temperature at which the hard coating film starts being oxidized was determined by measuring the weight of a sample obtained by coating the hard coating film on a platinum base by a thermobalance. The weight of the sample was measured while the sample was being heated at a heating rate of 4° C./min. An oxidation start point was defined by a temperature at which the weight of the sample started sharply increasing.

[Conditions for High-Temperature Slide Test]
  Apparatus: Vane-on-disk type sliding tester
  Vane: Vane of SKD61 (HRC 50)
  Disk: Disk of SKD11 (HRC 60) coated with the test film
  Sliding speed: 0.2 m/s
  Load: 500N
  Sliding distance: 2000 m
  Test temperature: 500° C.

Results of the slide test are shown in Tables 1 and 2. In Tables 1 and 2, values representing the compositions of the test hard coating films are expressed in atomic ratio. As obvious from Tables 1 and 2, wear depths of the hard coating films of sample numbers 4 to 8, 11 to 18, 20 to 26, 28, 29, 32 to 36, 38 to 41, 43, 44 and 49 to 52, namely, hard coating films meeting conditions for the hard coating film in the first aspect of the present invention, are smaller than those of the hard coating films of sample numbers 1 to 3, 9, 10, 19, 27, 30, 31, 37, 42, 45 to 48 and 52 to 53, namely, hard coating films not meeting conditions for the hard coating film in the first aspect of the present invention, and the same hard coating films are excellent in wear resistance.

Test 2

Hard coating films having compositions shown in Table 3 were formed by using the film deposition system shown in FIG. 1 having plural arc evaporation sources. Hard coating films for examining composition, hardness and crystal structure were formed on mirror-finished substrates of a hard metal. Hard coating films for an adhesion test were formed on substrates of SKD11 having a hardness of HRC 60. The substrates were placed in a deposition chamber, the deposition chamber was evacuated to a vacuum of $1\times10^{-3}$ Pa or below, the substrates were heated at about 400° C., and the surfaces of the substrates were subjected to a sputter cleaning process using Ar ions. The arc evaporation sources were 100 mm diameter targets. An arc current of 150 A was used. Films were deposited in an atmosphere of $N_2$ or a mixed gas of $N_2$ and $CH_4$ of 4 Pa in total pressure.

First, a 5 μm thick first coating layer A was formed on a substrate, namely, a base, by using targets having the same composition as the first coating layer A, a laminated film including layers each of the first coating layer A and the second coating layer B was formed on the first coating layer A by using both the targets for depositing the first coating layer A and targets having the same composition as the second coating layer B. The laminated film including the first coating layers A and the second coating layers B is an example of the foregoing laminated film including the coating layers C and D. Then, a 5 μm thick second coating film B was formed on the laminated film by using the targets for depositing the second coating film B. The lamination period of the laminated film was controlled through the control of the rotating speed of the substrate, and the thickness of each of the component layers of the laminated film was controlled through the control of deposition time. The first coating layer A was a CrN film. The second coating layer B was a film of $Ti_{0.2}Cr_{0.2}Al_{0.55}Si_{0.05}N$.

The composition, hardness and crystal structure of those hard coating films were examined. The hard coating films were subjected to a scratch test to test the adhesion of those hard coating films. Compositions and hardnesses of the hard coating films were determined by methods similar to those mentioned in the description of Test 1.

[Conditions for Scratch Test]
  Indenter: Diamond indenter (Tip radius: 200 atm)
  Scratching speed: 10 mm/min
  Load increasing rate: 100 N/min
  Scratching distance: 20 mm (Load: 0 to 200 N)

Results of the scratch test are shown in Table 3. As obvious from Table 3, the hard coating films of sample numbers 2A to 8A and 10A to 13A meeting the conditions required by the fourth aspect of the present invention are excellent in adhesion as compared with the hard coating films of sample numbers 1A, 9A and 14A meeting the conditions required by the first aspect of the present invention and not meeting the conditions required by the fourth aspect of the present invention.

Test 3

Hard coating films having compositions shown in Table 4 were formed by using the film deposition system shown in FIG. 1 having plural arc evaporation sources. Hard coating films for examining composition, hardness and crystal structure were formed on mirror-finished substrates of a hard metal. Metals shown in Table 4 were used for forming hard coating films for a high-temperature slide test. The substrates were placed in a deposition chamber, the deposition chamber was evacuated to a vacuum of $1\times10^{-3}$ Pa or below, the substrates were heated at about 400° C., and the surfaces of the substrates were subjected to a sputter cleaning process using Ar ions. The arc evaporation sources were 100 mm diameter targets. An arc current of 150 A was used. Films were deposited in an atmosphere of $N_2$ or a mixed gas of $N_2$ and $CH_4$ of 4 Pa in total pressure.

First, a 5 μm thick first coating layer A was formed on a substrate, namely, a base, by using targets having the same composition as the first coating layer A, a laminated film including layers each of the first coating layer A and the second coating layer B was formed on the first coating layer A by using both the targets for depositing the first coating layer A and targets having the same composition as the second coating layer B. The laminated film including the first coating layers A and the second coating layers B is an example of the foregoing laminated film including the coating layers C and D. Then, a 5 μm thick second coating film B was formed on the laminated film by using the targets for depositing the second coating film B. The lamination period of the laminated film was controlled through the control of the rotating speed of the substrate, and the thickness of each of the component layers of the laminated film was controlled through the control of deposition time. The first coating layer A was a CrN film. The second coating layer B was a film of $Ti_{0.2}Cr_{0.2}Al_{0.55}Si_{0.05}N$.

Some of the substrates for Examples 9B to 16B were subjected to a diffusion process for plasma nitriding or plasma carburizing under the following conditions.

[Plasma Nitriding Process]
  Temperature: 550° C.
  Time: 1 to 12 hr
  Atmosphere: Nitrogen −5% Ar
  Pressure: 100 Pa
  Plasma power source: Dc power source (1500 V)

[Plasma Carburizing Process]
  Temperature: 950° C.
  Time: 1 to 12 hr
  Atmosphere: Ar-5% methane
  Pressure: 100 Pa
  Plasma power source: Dc power source (1500 V)

The composition, hardness and crystal structure of those hard coating films were examined. The hard coating films were subjected to a high-temperature slide test and a wear resistance test. Compositions and hardnesses of the hard coating films were determined by methods similar to those mentioned in the description of Test 1. Test conditions for the high-temperature slide test were similar to those for Test 1.

Results of the tests are shown in Table 4. As obvious from Table 4, wear depths of the hard coating films of sample numbers 1B to 3B, 5B to 7B and 9B to 16B formed on Cr-containing iron-base alloy substrates having a hardness of HRC 50 or above are smaller than those of the hard coating films of sample numbers 4B and 8B formed on Cr-containing iron-base alloy substrates having a hardness of HRC 10 and the same hard coating films are excellent in wear resistance. Abrasion losses of the hard coating films of sample numbers 5B to 7B and 9B to 16B formed on the substrates containing a Cr-containing carbide precipitate and having the laminated film sandwiched between the first coating layer A and the second coating layer B are smaller than those of the hard coating films of sample numbers 1B to 3B formed on the same substrates containing a Cr-containing carbide precipitate and having the same hardness and not having the laminated film, and the same hard coating films are excellent in abrasion resistance. The substrates on which the hard coating films of sample numbers 2B and 6B were formed, respectively, have the same hardness of HRC 50, the substrates on which the hard coating films of sample numbers 1B, 5B and 9B to 16B were formed, respectively, have the same hardness of HRC 60, and the substrates on which the hard coating films of sample numbers 3B and 7B were formed, respectively, have the same hardness of HRC 65. Therefore, it may be proper to compare the hard coating films of ample numbers 2B and 6B, the hard coating films of sample numbers 1B, 5B and 9B to 16B, and the hard coating films of sample numbers 3B and 7B.

TABLE 1

| | | First coating layer A | | | | | | | Second coating layer B | | |
|---|---|---|---|---|---|---|---|---|---|---|---|
| | | | M | | | | | | | | |
| | | | | Content | | | | | | | |
| No. | Substrate | Cr | Element M | (atomic ratio) | B | C | N | Thickness (μm) | Ti | Cr | Al |
| 1 | SKD11 | | | — | | | | 0 | 1 | 0 | 0 |
| 2 | SKD11 | | | — | | | | 0 | 0.2 | 0.2 | 0.55 |
| 3 | SKD11 | 1 | | 0 | 0 | 0 | 1 | 0.5 | 0.2 | 0.2 | 0.55 |
| 4 | SKD11 | 1 | | 0 | 0 | 0 | 1 | 1 | 0.2 | 0.2 | 0.55 |
| 5 | SKD11 | 1 | | 0 | 0 | 0 | 1 | 3 | 0.2 | 0.2 | 0.55 |
| 6 | SKD11 | 1 | | 0 | 0 | 0 | 1 | 5 | 0.2 | 0.2 | 0.55 |
| 7 | SKD11 | 1 | | 0 | 0 | 0 | 1 | 7 | 0.2 | 0.2 | 0.55 |
| 8 | SKD11 | 1 | | 0 | 0 | 0 | 1 | 10 | 0.2 | 0.2 | 0.55 |
| 9 | SKD11 | 1 | | 0 | 0 | 0 | 1 | 5 | 0.2 | 0.2 | 0.55 |
| 10 | SKD11 | 1 | | 0 | 0 | 0 | 1 | 5 | 0.2 | 0.2 | 0.55 |
| 11 | SKD11 | 1 | | 0 | 0 | 0 | 1 | 5 | 0.2 | 0.2 | 0.55 |
| 12 | SKD11 | 1 | | 0 | 0 | 0 | 1 | 5 | 0.2 | 0.2 | 0.55 |

TABLE 1-continued

| No. | Substrate | Cr | Element M | Content | B | C | N | Thickness (μm) | Ti | Cr | Al |
|---|---|---|---|---|---|---|---|---|---|---|---|
| 13 | SKD11 | 1 |   |   | 0 | 0 | 0 | 1 | 5 | 0.2 | 0.2 | 0.55 |
| 14 | SKD11 | 1 |   |   | 0 | 0 | 0 | 1 | 5 | 0.2 | 0.2 | 0.55 |
| 15 | SKD11 | 0.9 | W | 0.1 | 0 | 0 | 1 | 5 | 0.2 | 0.2 | 0.55 |
| 16 | SKD11 | 0.8 | W | 0.2 | 0 | 0 | 1 | 5 | 0.2 | 0.2 | 0.55 |
| 17 | SKD11 | 0.5 | W | 0.5 | 0 | 0 | 1 | 5 | 0.2 | 0.2 | 0.55 |
| 18 | SKD11 | 0.3 | W | 0.7 | 0 | 0 | 1 | 5 | 0.2 | 0.2 | 0.55 |
| 19 | SKD11 | 0.1 | W | 0.9 | 0 | 0 | 1 | 5 | 0.2 | 0.2 | 0.55 |
| 20 | SKD11 | 0.6 | V | 0.4 | 0 | 0 | 1 | 5 | 0.2 | 0.2 | 0.55 |
| 21 | SKD11 | 0.7 | Mo | 0.3 | 0 | 0 | 1 | 5 | 0.2 | 0.2 | 0.55 |
| 22 | SKD11 | 0.9 | Nb | 0.1 | 0 | 0 | 1 | 5 | 0.2 | 0.2 | 0.55 |
| 23 | SKD11 | 0.5 | Ti | 0.5 | 0 | 0 | 1 | 5 | 0.2 | 0.2 | 0.55 |
| 24 | SKD11 | 0.4 | Al | 0.6 | 0 | 0 | 1 | 5 | 0.2 | 0.2 | 0.55 |
| 25 | SKD11 | 1 |   |   | 0 | 0.1 | 0 | 0.9 | 5 | 0.2 | 0.2 | 0.55 |
| 26 | SKD11 | 1 |   |   | 0 | 0.2 | 0 | 0.8 | 5 | 0.2 | 0.2 | 0.55 |
| 27 | SKD11 | 1 |   |   | 0 | 0.3 | 0 | 0.7 | 5 | 0.2 | 0.2 | 0.55 |

|   | Second coating layer B | | | | | | Measured data | | |
|---|---|---|---|---|---|---|---|---|---|
| No. | Si | Y | B | C | N | Thickness (μm) | Hardness of hard coating film (GPa) | Oxidation start temperature (°C.) | Abrasion loss (μm) |
| 1 | 0 | 0 | 0 | 0 | 1 | 10 | 22 | 550 | >10 |
| 2 | 0.05 | 0 | 0 | 0 | 1 | 10 | 30 | 1100 | 7 |
| 3 | 0.05 | 0 | 0 | 0 | 1 | 5 | 30 | 1100 | 7 |
| 4 | 0.05 | 0 | 0 | 0 | 1 | 5 | 30 | 1100 | 3.7 |
| 5 | 0.05 | 0 | 0 | 0 | 1 | 5 | 30 | 1100 | 2.5 |
| 6 | 0.05 | 0 | 0 | 0 | 1 | 5 | 30 | 1100 | 1.8 |
| 7 | 0.05 | 0 | 0 | 0 | 1 | 5 | 30 | 1100 | 1.7 |
| 8 | 0.05 | 0 | 0 | 0 | 1 | 5 | 30 | 1100 | 1.8 |
| 9 | 0.05 | 0 | 0 | 0 | 1 | 0 | 30 | 1100 | >10 |
| 10 | 0.05 | 0 | 0 | 0 | 1 | 1 | 30 | 1100 | 6 |
| 11 | 0.05 | 0 | 0 | 0 | 1 | 2 | 30 | 1100 | 3 |
| 12 | 0.05 | 0 | 0 | 0 | 1 | 3 | 30 | 1100 | 2 |
| 13 | 0.05 | 0 | 0 | 0 | 1 | 5 | 30 | 1100 | 1.5 |
| 14 | 0.05 | 0 | 0 | 0 | 1 | 10 | 30 | 1100 | 2.5 |
| 15 | 0.05 | 0 | 0 | 0 | 1 | 5 | 30 | 1100 | 2.6 |
| 16 | 0.05 | 0 | 0 | 0 | 1 | 5 | 30 | 1100 | 2.2 |
| 17 | 0.05 | 0 | 0 | 0 | 1 | 5 | 30 | 1100 | 2.2 |
| 18 | 0.05 | 0 | 0 | 0 | 1 | 5 | 30 | 1100 | 2.6 |
| 19 | 0.05 | 0 | 0 | 0 | 1 | 5 | 30 | 1100 | 6.7 |
| 20 | 0.05 | 0 | 0 | 0 | 1 | 5 | 30 | 1100 | 2.6 |
| 21 | 0.05 | 0 | 0 | 0 | 1 | 5 | 30 | 1100 | 2.6 |
| 22 | 0.05 | 0 | 0 | 0 | 1 | 5 | 30 | 1100 | 2.4 |
| 23 | 0.05 | 0 | 0 | 0 | 1 | 5 | 30 | 1100 | 2.8 |
| 24 | 0.05 | 0 | 0 | 0 | 1 | 5 | 30 | 1100 | 2 |
| 25 | 0.05 | 0 | 0 | 0 | 1 | 5 | 30 | 1100 | 2.4 |
| 26 | 0.05 | 0 | 0 | 0 | 1 | 5 | 30 | 1100 | 2.6 |
| 27 | 0.05 | 0 | 0 | 0 | 1 | 5 | 30 | 1100 | 6.2 |

TABLE 2

|   |   | First coating layer A | | | | | | Second coating layer B | | |
|---|---|---|---|---|---|---|---|---|---|---|
|   |   |   | M | | | | | | | |
|   |   |   | Element M | Content (atomic ratio) | B | C | N | Thickness (μm) | Ti | Cr | Al |
| No. | Substrate | Cr | | | | | | | | | |
| 28 | SKD11 | 1 |   | 0 | 0 | 0.2 | 1 | 5 | 0.2 | 0.2 | 0.55 |
| 29 | SKD11 | 1 |   | 0 | 0 | 0.5 | 1 | 5 | 0.2 | 0.2 | 0.55 |
| 30 | SKD11 | 1 |   | 0 | 0 | 0.7 | 1 | 5 | 0.2 | 0.2 | 0.55 |
| 31 | SKD11 | 1 |   | 0 | 0 | 0 | 1 | 5 | 0.35 | 0.35 | 0.3 |
| 32 | SKD11 | 1 |   | 0 | 0 | 0 | 1 | 5 | 0.3 | 0.3 | 0.4 |
| 33 | SKD11 | 1 |   | 0 | 0 | 0 | 1 | 5 | 0.2 | 0.2 | 0.6 |
| 34 | SKD11 | 1 |   | 0 | 0 | 0 | 1 | 5 | 0.1 | 0.3 | 0.6 |
| 35 | SKD11 | 1 |   | 0 | 0 | 0 | 1 | 5 | 0.3 | 0.1 | 0.6 |
| 36 | SKD11 | 1 |   | 0 | 0 | 0 | 1 | 5 | 0.15 | 0.15 | 0.7 |
| 37 | SKD11 | 1 |   | 0 | 0 | 0 | 1 | 5 | 0.1 | 0.1 | 0.8 |
| 38 | SKD11 | 1 |   | 0 | 0 | 0 | 1 | 5 | 0.19 | 0.19 | 0.6 |
| 39 | SKD11 | 1 |   | 0 | 0 | 0 | 1 | 5 | 0.175 | 0.175 | 0.6 |
| 40 | SKD11 | 1 |   | 0 | 0 | 0 | 1 | 5 | 0.15 | 0.15 | 0.6 |
| 41 | SKD11 | 1 |   | 0 | 0 | 0 | 1 | 5 | 0.125 | 0.125 | 0.6 |
| 42 | SKD11 | 1 |   | 0 | 0 | 0 | 1 | 5 | 0.1 | 0.1 | 0.6 |

TABLE 2-continued

| 43 | SKD11 | 1 | | 0 | 0 | 0 | 1 | 5 | 0 | 0.4 | 0.6 |
| 44 | SKD11 | 1 | | 0 | 0 | 0 | 1 | 5 | 0 | 0.5 | 0.5 |
| 45 | SKD11 | 1 | | 0 | 0 | 0 | 1 | 5 | 0 | 0.7 | 0.3 |
| 46 | SKD11 | 1 | | 0 | 0 | 0 | 1 | 5 | 0.4 | 0 | 0.6 |
| 47 | SKD11 | 1 | | 0 | 0 | 0 | 1 | 5 | 0.5 | 0 | 0.5 |
| 48 | SKD11 | 1 | | 0 | 0 | 0 | 1 | 5 | 0.7 | 0 | 0.3 |
| 49 | SKD11 | 1 | | 0 | 0 | 0 | 1 | 5 | 0.2 | 0.2 | 0.55 |
| 50 | SKD11 | 1 | | 0 | 0 | 0 | 1 | 5 | 0.185 | 0.185 | 0.55 |
| 51 | SKD11 | 1 | | 0 | 0 | 0 | 1 | 5 | 0.16 | 0.16 | 0.55 |
| 52 | SKD11 | 1 | | 0 | 0 | 0 | 1 | 5 | 0.135 | 0.135 | 0.55 |
| 53 | SKD11 | 1 | | 0 | 0 | 0 | 1 | 5 | 0.11 | 0.11 | 0.55 |

| | Second coating layer B | | | | | | Measured data | | |
| | | | | | | | Hardness of | Oxidation start | Abrasion |
| No. | Si | Y | B | C | N | Thickness (μm) | hard coating film (GPa) | temperature (° C.) | loss (μm) |
|---|---|---|---|---|---|---|---|---|---|
| 28 | 0.05 | 0 | 0 | 0 | 1 | 5 | 30 | 1100 | 2.6 |
| 29 | 0.05 | 0 | 0 | 0 | 1 | 5 | 30 | 1100 | 2.1 |
| 30 | 0.05 | 0 | 0 | 0 | 1 | 5 | 30 | 1100 | 6.4 |
| 31 | 0 | 0 | 0 | 0 | 1 | 5 | 22 | 600 | 7.5 |
| 32 | 0 | 0 | 0 | 0 | 1 | 5 | 27 | 800 | 4.5 |
| 33 | 0 | 0 | 0 | 0 | 1 | 5 | 30 | 900 | 3 |
| 34 | 0 | 0 | 0 | 0 | 1 | 5 | 30 | 950 | 2.9 |
| 35 | 0 | 0 | 0 | 0 | 1 | 5 | 30 | 880 | 3.1 |
| 36 | 0 | 0 | 0 | 0 | 1 | 5 | 32 | 1000 | 4 |
| 37 | 0 | 0 | 0 | 0 | 1 | 5 | 26 | 1100 | 7.5 |
| 38 | 0.02 | 0 | 0 | 0 | 1 | 5 | 32 | 1050 | 1.2 |
| 39 | 0.05 | 0 | 0 | 0 | 1 | 5 | 35 | 1100 | 1 |
| 40 | 0.1 | 0 | 0 | 0 | 1 | 5 | 33 | 1150 | 2 |
| 41 | 0.15 | 0 | 0 | 0 | 1 | 5 | 32 | 1150 | 2.5 |
| 42 | 0.2 | 0 | 0 | 0 | 1 | 5 | 22 | 1200 | 7.3 |
| 43 | 0 | 0 | 0 | 0 | 1 | 5 | 29 | 1000 | 4.1 |
| 44 | 0 | 0 | 0 | 0 | 1 | 5 | 26 | 850 | 4 |
| 45 | 0 | 0 | 0 | 0 | 1 | 5 | 22 | 700 | 8.1 |
| 46 | 0 | 0 | 0 | 0 | 1 | 5 | 29 | 950 | 4.7 |
| 47 | 0 | 0 | 0 | 0 | 1 | 5 | 27 | 800 | 4.6 |
| 48 | 0 | 0 | 0 | 0 | 1 | 5 | 23 | 650 | 8.2 |
| 49 | 0.03 | 0.02 | 0 | 0 | 1 | 5 | 32 | 1150 | 2.3 |
| 50 | 0.03 | 0.05 | 0 | 0 | 1 | 5 | 32 | 1200 | 2.4 |
| 51 | 0.03 | 0.1 | 0 | 0 | 1 | 5 | 30 | 1200 | 2.2 |
| 52 | 0.03 | 0.15 | 0 | 0 | 1 | 5 | 29 | 1250 | 3.7 |
| 53 | 0.03 | 0.2 | 0 | 0 | 1 | 5 | 20 | 1250 | 7.5 |

TABLE 3

| No. | Substrate | Lamination period (nm) | Thickness (μm) | Adhesion (N) |
|---|---|---|---|---|
| 1A | SKD11 | — | 0 | 120 |
| 2A | SKD11 | 50 | 0.1 | 150 |
| 3A | SKD11 | 50 | 0.5 | 160 |
| 4A | SKD11 | 50 | 1 | 170 |
| 5A | SKD11 | 50 | 2 | 180 |
| 6A | SKD11 | 50 | 5 | 180 |
| 7A | SKD11 | 50 | 7 | 170 |
| 8A | SKD11 | 50 | 10 | 160 |
| 9A | SKD11 | 5 | 1.5 | 120 |
| 10A | SKD11 | 10 | 1.5 | 150 |
| 11A | SKD11 | 50 | 1.5 | 180 |
| 12A | SKD11 | 100 | 1.5 | 170 |
| 13A | SKD11 | 300 | 1.5 | 150 |
| 14A | SKD11 | 500 | 1.5 | 120 |

Note:
First coating layer: CrN (5 μm),
Second coating layer B: $Ti_{0.2}Cr_{0.2}Al_{0.55}Si_{0.05}N$ (5 μm)

TABLE 4

| No. | First coating layer A | Laminated film | Second coating layer B |
|---|---|---|---|
| 1B | | | $Ti0.2Cr0.2Al0.55Si0.05N$: 10 μm |
| 2B | | | $Ti0.2Cr0.2Al0.55Si0.05N$: 10 μm |
| 3B | | | $Ti0.2Cr0.2Al0.55Si0.05N$: 10 μm |
| 4B | | | $Ti0.2Cr0.2Al0.55Si0.05N$: 10 μm |
| 5B | CrN: 5 μm | Lamination period: 50 nm, Thickness: 1.5 μm | $Ti0.2Cr0.2Al0.55Si0.05N$: 5 μm |
| 6B | CrN: 5 μm | Lamination period: 50 nm, Thickness: 1.5 μm | $Ti0.2Cr0.2Al0.55Si0.05N$: 5 μm |
| 7B | CrN: 5 μm | Lamination period: 50 nm, Thickness: 1.5 μm | $Ti0.2Cr0.2Al0.55Si0.05N$: 5 μm |
| 8B | CrN: 5 μm | Lamination period: 50 nm, Thickness: 1.5 μm | $Ti0.2Cr0.2Al0.55Si0.05N$: 5 μm |
| 9B | CrN: 5 μm | Lamination period: 50 nm, Thickness: 1.5 μm | $Ti0.2Cr0.2Al0.55Si0.05N$: 5 μm |
| 10B | CrN: 5 μm | Lamination period: 50 nm, Thickness: 1.5 μm | $Ti0.2Cr0.2Al0.55Si0.05N$: 5 μm |

TABLE 4-continued

| | | | |
|---|---|---|---|
| 11B | CrN: 5 μm | Lamination period: 50 nm, Thickness: 1.5 μm | Ti0.2Cr0.2Al0.55Si0.05N: 5 μm |
| 12B | CrN: 5 μm | Lamination period: 50 nm, Thickness: 1.5 μm | Ti0.2Cr0.2Al0.55Si0.05N: 5 μm |
| 13B | CrN: 5 μm | Lamination period: 50 nm, Thickness: 1.5 μm | Ti0.2Cr0.2Al0.55Si0.05N: 5 μm |
| 14B | CrN: 5 μm | Lamination period: 50 nm, Thickness: 1.5 μm | Ti0.2Cr0.2Al0.55Si0.05N: 5 μm |
| 15B | CrN: 5 μm | Lamination period: 50 nm, Thickness: 1.5 μm | Ti0.2Cr0.2Al0.55Si0.05N: 5 μm |
| 16B | CrN: 5 μm | Lamination period: 50 nm, Thickness: 1.5 μm | Ti0.2Cr0.2Al0.55Si0.05N: 5 μm |

| | | Base | | | | |
|---|---|---|---|---|---|---|
| No. | Element M | Diffusion | thickness of diffusion layer (μm) | Hardness (HRC) | Carbide precipitate | Abrasion loss (μm) |
| 1B | SKD11 | Not processed | — | 60 | Contained | 3 |
| 2B | SKD61 | Not processed | — | 50 | Contained | 7 |
| 3B | SKH51 | Not processed | — | 65 | Contained | 6 |
| 4B | SUS304 | Not processed | — | 10 | Not contained | >10 |
| 5B | SKD11 | Not processed | — | 60 | Contained | 1.2 |
| 6B | SKD61 | Not processed | — | 50 | Contained | 1.5 |
| 7B | SKH51 | Not processed | — | 65 | Contained | 1 |
| 8B | SUS304 | Not processed | — | 10 | Not contained | 4.5 |
| 9B | SKD11 | Nitriding | 5 | 60 | Contained | 1.2 |
| 10B | SKD11 | Nitriding | 10 | 60 | Contained | 0.8 |
| 11B | SKD11 | Nitriding | 50 | 60 | Contained | 0.7 |
| 12B | SKD11 | Nitriding | 100 | 60 | Contained | 0.7 |
| 13B | SKD11 | Carburizing | 100 | 60 | Contained | 1 |
| 14B | SKD11 | Carburizing | 500 | 60 | Contained | 0.8 |
| 15B | SKD11 | Carburizing | 1000 | 60 | Contained | 0.5 |
| 16B | SKD11 | Carburizing | 2000 | 60 | Contained | 0.5 |

As apparent from the foregoing description, the hard coating film of the present invention is superior to the conventional surface coating film in wear resistance and seizure resistance, and is suitable for coating the forming tool, such as a forming die to improve the durability of the forming tool.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A hard coating film for coating a forming die of an alloy comprising iron and a Cr-containing precipitated carbide, said hard coating film comprising:

a first coating layer A of a thickness between 3 and 10 μm formed on the forming die of the alloy; and a second coating layer B of a thickness between 2 and 10 82 m overlying the coating layer A;

wherein the first coating layer A is a film of $Cr_{l-x}M_x(B_aC_bN_{l-a-b})$ meeting conditions expressed by expressions:

$$0 \leq x \leq 0.7 \tag{1A}$$

$$0 \leq a \leq 0.2 \tag{2A}$$

$$0 \leq b \leq 0.5 \tag{3A}$$

wherein M is at least one element among W, V, Mo, Nb, Ti and Al, x is atomic ratio of M, a is atomic ratio of B and b is atomic ratio of C, and the second coating layer B is a film of $Ti_{l-X-Y-Z}Cr_XAl_YSi_ZN$ meeting conditions expressed by expressions:

$$0 \leq l-X-Y-Z \leq 0.5 \tag{1B}$$

$$0 < X \leq 0.5 \tag{2B}$$

$$0.4 \leq Y \leq 0.7 \tag{3B}$$

$$0.01 \leq Z \leq 0.15 \tag{4B}$$

wherein X is atomic ratio of Cr, Y is atomic ratio of Al, and Z is atomic ratio of Si and wherein the forming die has a Rockwell hardness of HRC 50 or above.

2. The hard coating film according to claim 1, further comprising a laminated film formed by laminating coating layers C and/or coating layers D between the first coating layer A and the second coating layer B, wherein the laminating coating layers C are the same as or different from the first coating layer A and the laminating coating layers D are the same as or different from the second coating layer B, wherein each of the coating layers C and D are laminated at a lamination period of 300 nm or less and having a thickness of 300 nm or less, and a total thickness of the coating layers C and D is 0.1 μm or greater.

3. The hard coating film according to claim 2, wherein the second coating layer B is a single layer.

4. The hard coating film according to claim 2, wherein $0.5 \leq Y \leq 0.6$ and $0.01 \leq Z \leq 0.05$.

5. The hard coating film according to claim 1, wherein the forming die has a surface diffusion layer formed by subjecting the surface thereof to nitriding, carburizing or carbonitriding.

6. The hard coating film according to claim 1, wherein the second coating layer B is a single layer.

7. The hard coating film according to claim 1, wherein $0.5 \leq Y \leq 0.6$ and $0.01 \leq Z \leq 0.05$.

8. A forming die having a surface coated with the hard coating film according to claim 1.

* * * * *